United States Patent
Angelo et al.

(10) Patent No.: US 12,482,723 B2
(45) Date of Patent: Nov. 25, 2025

(54) BACKSIDE METALLIZATION OF FLIP-CHIP SEMICONDUCTOR DEVICES

(71) Applicant: Raytheon Company, Arlington, VA (US)

(72) Inventors: Nick Angelo, McKinney, TX (US); Ashish Mody, Allen, TX (US); Michelle Moholt, Gunter, TX (US)

(73) Assignee: Raytheon Company, Arlington, VA (US)

( * ) Notice: Subject to any disclaimer, the term of this patent is extended or adjusted under 35 U.S.C. 154(b) by 502 days.

(21) Appl. No.: 17/837,396

(22) Filed: Jun. 10, 2022

(65) Prior Publication Data
US 2023/0402347 A1 Dec. 14, 2023

(51) Int. Cl.
*H01L 23/48* (2006.01)
*H01L 23/485* (2006.01)
*H01L 23/498* (2006.01)

(52) U.S. Cl.
CPC .......... *H01L 23/481* (2013.01); *H01L 23/485* (2013.01); *H01L 23/49827* (2013.01)

(58) Field of Classification Search
CPC ............ H01L 23/481; H01L 23/485; H01L 23/49827
See application file for complete search history.

(56) References Cited

U.S. PATENT DOCUMENTS

| 7,884,625 B2 | 2/2011 | Bartley et al. |
| 7,952,478 B2 | 5/2011 | Bartley et al. |
| 2015/0108606 A1* | 4/2015 | Lamy .................... H01L 23/573 257/532 |
| 2015/0235969 A1 | 8/2015 | Zhang et al. |
| 2022/0115329 A1* | 4/2022 | Kantarovsky ....... H01L 23/5226 |

FOREIGN PATENT DOCUMENTS

WO 2023239493 12/2023

OTHER PUBLICATIONS

International Search Report and Written Opinion in Application No. PCT/US2023/020408 dated Aug. 29, 2023, 15 pages.
"International Application Serial No. PCT US2023 020408, International Preliminary Report on Patentability mailed Dec. 19, 2024", 10 pgs.

* cited by examiner

*Primary Examiner* — Richard A Booth
(74) *Attorney, Agent, or Firm* — Schwegman Lundberg & Woessner, P.A.

(57) ABSTRACT

An electronic device is provided having a bulk Si layer and an active region positioned on the bulk Si layer. The active region includes at least one semiconductor component defined by a device layout or functions of the electronic device. An opaque structure is positioned on the bulk Si layer or within the bulk Si layer. The opaque structure is configured to prevent visual or IR imaging of the electronic device to determine the device layout or functions.

6 Claims, 5 Drawing Sheets

BACKSIDE METALLIZATION OF FLIP-CHIP SEMICONDUCTOR DEVICES

BACKGROUND

Often, nefarious groups utilize various techniques to garner information from protected technologies for their competitive advantage. This is especially prevalent in flip-chip devices designed by fabless companies. These nefarious groups can reverse-engineer the proprietary architecture and design of such devices by using backside imaging techniques which leads to loss of profit and compromise of integrity.

There is a need to protect technologies deployed on flip-chip devices by preventing imaging through their backsides.

SUMMARY

According to one aspect of the subject matter described in this disclosure, an electronic device is provided. The electronic device includes a bulk Si layer. An active region is positioned on the bulk Si layer. The active region includes at least one semiconductor component defined by a device layout or functions of the electronic device. An opaque structure is positioned on the bulk Si layer or within the bulk Si layer. The opaque structure is configured to prevent visual or IR imaging of the electronic device to determine the device layout or functions.

According to another aspect of the subject matter described in this disclosure, an electronic device is provided. The electronic device includes a bulk Si layer. An active region is positioned on the bulk Si layer. The active region includes at least one semiconductor component defined by a device layout or functions of the electronic device. An opaque structure positioned on the bulk Si layer or within the bulk Si layer. The opaque structure is configured to prevent visual or IR imaging of a region of the electronic device.

According to another aspect of the subject matter described in this disclosure, a method for forming an electronic device is provided. The method includes providing a bulk Si layer. An active region is formed on the bulk Si layer. The active region comprises at least one semiconductor component defined by a device layout or functions of the electronic device. Moreover, the method includes forming an opaque structure on the bulk Si layer or within the bulk Si layer. The opaque structure is configured to prevent visual or IR imaging of the electronic device to determine the device layout or functions.

Additional features and advantages of the present disclosure are described in, and will be apparent from, the detailed description.

BRIEF DESCRIPTION OF THE DRAWINGS

The disclosure is illustrated by way of example, and not by way of limitation, in the figures of the accompanying drawings in which like reference numerals are used to refer to similar elements. It is emphasized that various features may not be drawn to scale and the dimensions of various features may be arbitrarily increased or reduced for clarity of discussion.

DETAILED DESCRIPTION

The figures and descriptions provided herein may have been simplified to illustrate aspects that are relevant for a clear understanding of the herein described devices, systems, and methods, while eliminating, for the purpose of clarity, other aspects that may be found in typical similar devices, systems, and methods. Those of ordinary skill may recognize that other elements and/or operations may be desirable and/or necessary to implement the devices, systems, and methods described herein. But because such elements and operations are well known in the art, and because they do not facilitate a better understanding of the present disclosure, a discussion of such elements and operations may not be provided herein. However, the present disclosure is deemed to inherently include all such elements, variations, and modifications to the described aspects that would be known to those of ordinary skill in the art.

The terminology used herein is for the purpose of describing particular example embodiments only and is not intended to be limiting. For example, as used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc., may be used herein to describe various elements, components, regions, layers and/or sections, these elements, components, regions, layers and/or sections should not be limited by these terms. These terms may be only used to distinguish one element, component, region, layer or section from another element, component, region, layer or section. That is, terms such as "first," "second." and other numerical terms, when used herein, do not imply a sequence or order unless clearly indicated by the context.

This disclosure describes a structure composed of a series of deposited layers to form an opaque structure. The opaqueness of the structure deters visual and IR imaging of a device layout/functions formed on a flip-chip or the like. Moreover, the disclosure describes implementing electrical connectivity for grounding the opaque structure.

Figure 1:
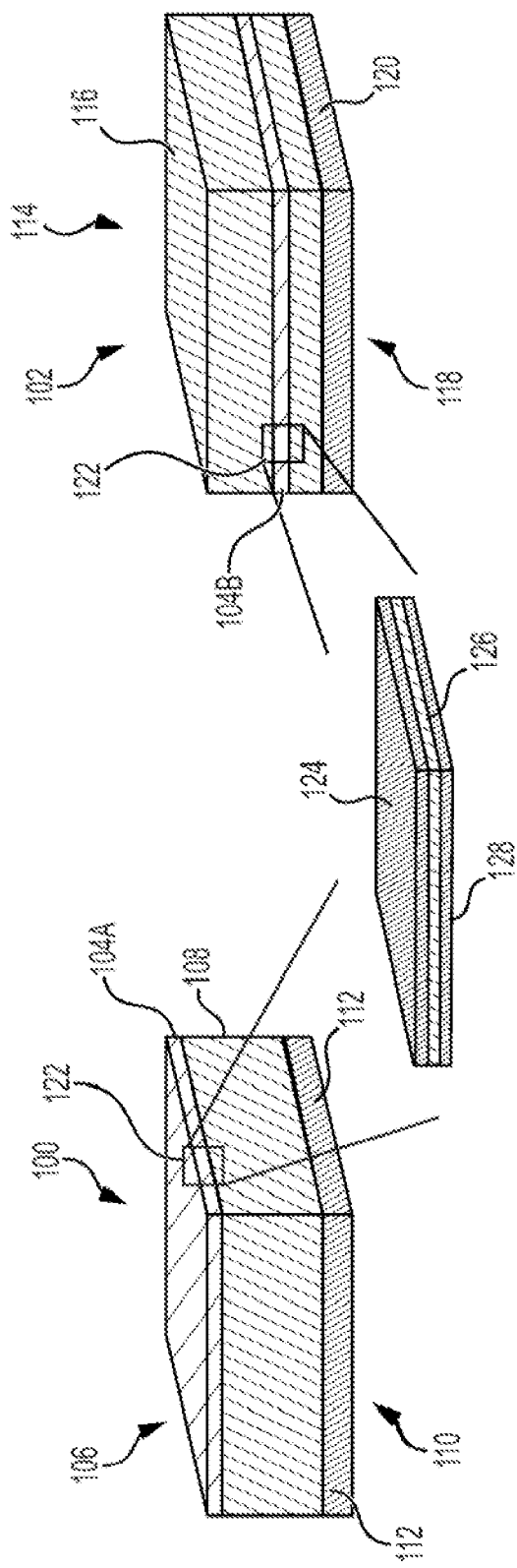
FIG. 1 is a schematic diagram of two flip-chip devices having opaque structures, in accordance with some embodiments.

FIG. 1 is a schematic diagram of two flip-chip devices 100 and 102 having opaque structures 104A and 104B, in accordance with some embodiments. With respect to FIG. 1, it is a reversed view of flip-chip devices 100 and 102. In particular, the flip-chip device 100 includes a back-side region 106, which includes a bulk (Si) 108 positioned on an opaque structure 104A. A front-side region 110 of flip-chip device 100 includes an active region 112 positioned on the bulk Si 108. The active region 112 comprises the features of flip-chip device 100. The features may consist of fabricated semiconductor components such as field-effect transistors (FETs), bumps, routing components, or the like. Moreover, a back-side region 114 of flip-chip device 102 includes a bulk (Si) layer 116 with an opaque structure 104B positioned within. A front-side region 118 of flip-chip device 102 having an active region 120 positioned on bulk Si 116. The active region 120 includes the features of the flip-chip device 100.

Inlet 122 shows a detailed view of opaque structure 104A and 104B. Each opaque structure 104A and 104B includes a first metal layer 124 positioned on an insulator 126. The insulator layer 126 is positioned on a second metal layer 128. The opaqueness of the structures 104A and 104B are designed to deter/prevent visual and IR imaging of flip-chip devices 100 and 102 to prevent others from determining their architecture, layout, and functions.

In some embodiments, the opaque structures 104A and 104B may be composed of a series of deposited layers of metal and dielectric materials. The first metal layer 124 and the second metal layer 128 are different metals in some embodiments. In some embodiments, the opaque structures 104A and 104B may be formed of other varying material layers besides metal and/or dielectric to have a specific opaqueness or electrical property.

In some implementations, the opaqueness of the opaque structures 104A and 104B is based on materials forming active regions 112 and 120 of flip-chip devices 100 and 102. In some implementations, the opaqueness of the opaque structures 104A and 104B may be based on imaging equipment used to image devices 100 and 102. In some implementations, the opaque structures 104A and 104B are configured to absorb and/or block wavelengths used by devices for visual or IR imaging of devices 100 and 102.

In some embodiments, the opaque structure 104B may cover the entire backside of device 100. In some embodiments, the opaque structure 104B may positioned anywhere in bulk Si that is feasibly possible. In some embodiments, the opaque structures 104A and 104B may only cover select area(s) of devices 102 and 100 device that may be of interest for imaging.

Figure 2:
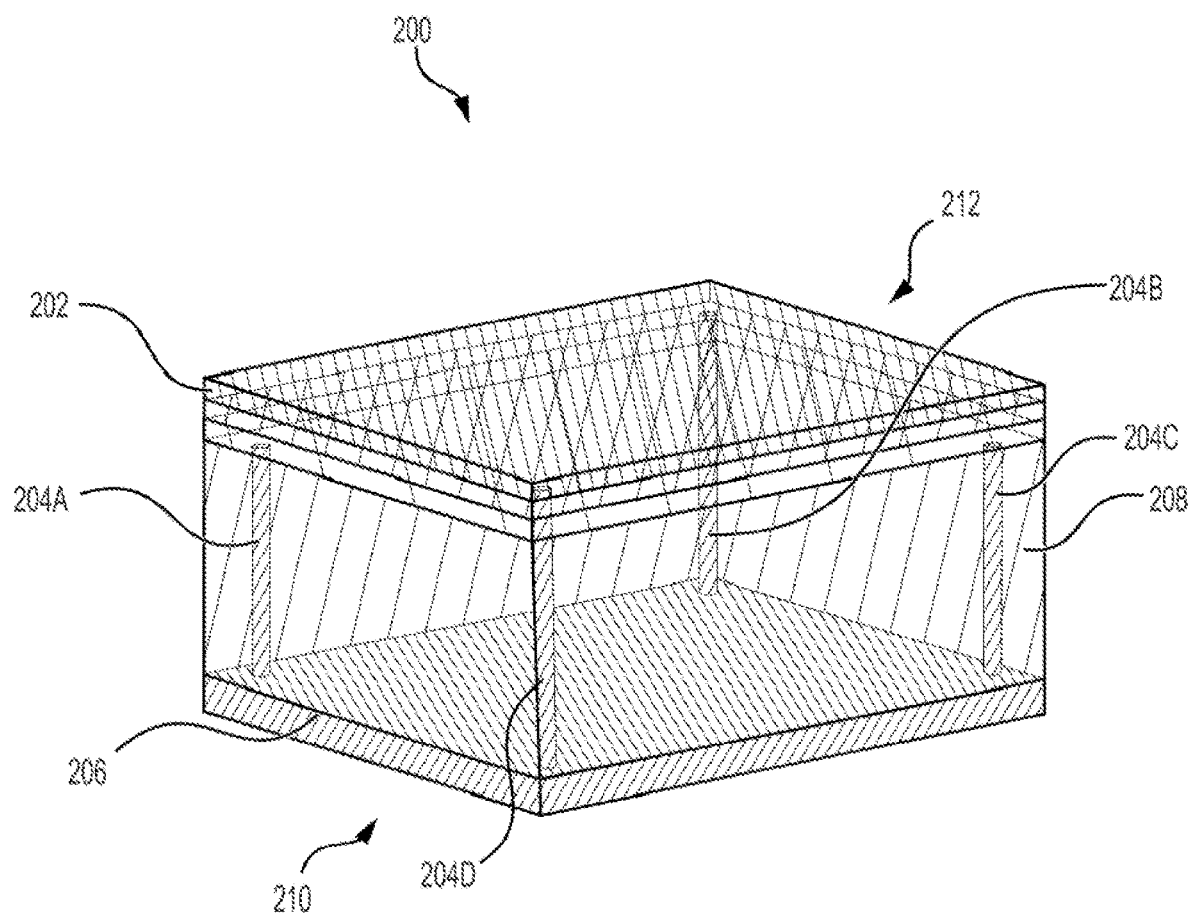
FIG. 2 is a schematic diagram a flip-chip device having Through Silicon Vias (TSVs), in accordance with some embodiments.

FIG. 2 is a schematic diagram a flip-chip device 200 having Through Silicon Vias (TSVs) 204A-204D, in accordance with some embodiments. In particular, FIG. 2 shows a back-side region 212 of flip-chip device 200 includes an opaque structure 202. The opaque structure 202 may be similar to opaque structure 104A of FIG. 1. A bulk Si layer 208 is positioned on opaque structure 202. In front-side region 210 of flip-chip device 200, an active region 206 is positioned on bulk Si layer 208.

The flip-chip device 200 includes a number Through Silicon Vias (TSVs) 204A-204D around the periphery of flip-chip device 200. The TSVs 204A-204D provide electrical connectivity to the opaque structure 202. Each TSV 204A-204D has one distal end connected to active region 206 and the other distal end connected to opaque structure 202 and passes through the bulk Si layer 208. The TSVs 204A-204D are formed in flip-chip device 200 using commonly used techniques in the art.

In some embodiments, the TSVs 204A-204D provide electrical connectivity to metal layers of opaque structure 202 by establishing a ground reference for flip-chip device 200. In this case, the opaque structure 202 performs as a grounded substrate.

In some implementations, the TSVs 204A-204D provide vertical electrical connectivity between flip-chip device 200 and at least one other flip-chip device.

Figure 3:
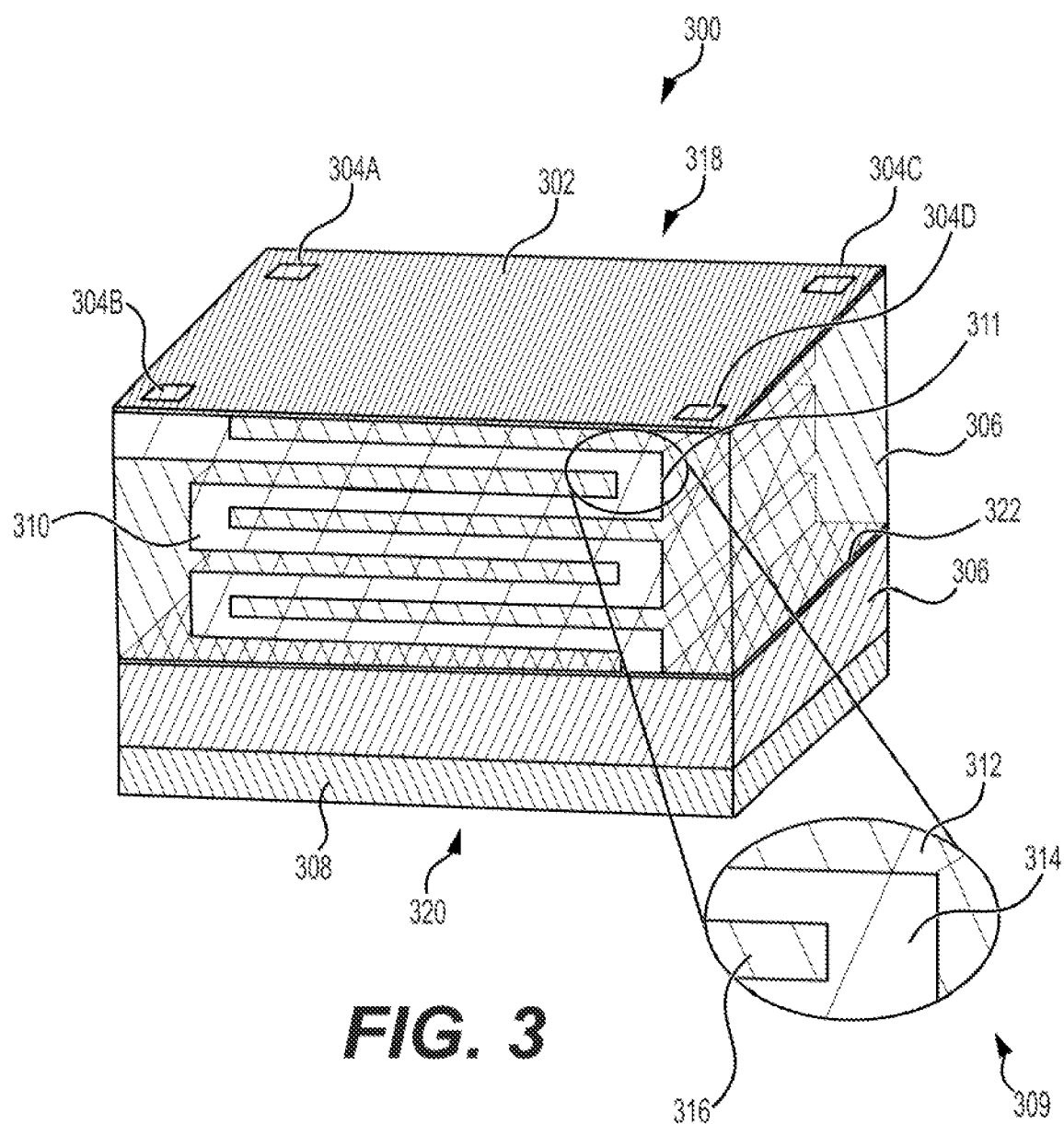
FIG. 3 is a schematic diagram of a flip device 300 having interwoven layers 310, in accordance with some embodiments.

FIG. 3 is a schematic diagram of a flip device 300 having interwoven layers 310, in accordance with some embodiments. With respect to FIG. 3, a back-side region 318 of flip-chip device 300 includes a bottom region 302 of interwoven layer 310. Several bond pads 304A-304D are positioned on and at the periphery of bottom region 302 of interwoven layer 310. The front-side region 320 of flip-chip device 300 includes an active region 308 positioned on bulk Si layer 306.

Interwoven layers 310 are formed and positioned within the bulk Si layer 306. Inlet 309 shows a detailed view of a region 311 of interwoven layers 310. In this case, the region 311 shows interwoven layers 310 having a patterned first metal layer 312 positioned on or around a patterned insulator layer 314. The patterned insulator layer 314 is positioned on or around a second metal layer 316. Overall, the interwoven layers 310 include multiple patterned layers of metal and insulator materials. Moreover, the interwoven layers 310 may be positioned anywhere within the bulk Si region 306.

Correspondingly, interwoven layers 310 are configured to provide an opaque barrier for deterring visual and IR imaging of the flip-chip device's 300 architecture/layout/functions formed on a flip-chip or the like. Moreover, interwoven layers 310 alter the opaqueness of bulk Si layer 306 due to its position within bulk Si layer 306. In this implementation, the flip-chip device 300 includes an extensive region of opaque material because interwoven layers 310 extend from back-side region 318 of flip-chip device 300 to a region 322 of bulk Si layer 306. Active region 308 is positioned on a different region of bulk Si layer 306 having a defined distance away from region 322. This makes it difficult to get visual or IR imaging from back-side region 318 or through bulk Si layer 306 due to interwoven layers 310.

In some implementations, the opaqueness of the interwoven layers 310 is based on materials forming the active region 308. In some implementations, the opaqueness of the interwoven layers 310 may be based on imaging equipment used to image flip-chip device 300.

The bond pads 304A-304D are utilized to provide electrical connectivity in device 300. In some embodiments, the bond pads 304A-304D provide electrical connectivity to the patterned metal layers 312 and 316 of interwoven layers 310 by establishing a ground reference for flip-chip device 300. In this case, the bottom region 302 of interwoven layers 310 may operate as a grounded substrate. In some implementations, the bond pads 304A-304D may provide electrical connectivity between flip-chip device 300 and at least one other flip-chip device.

In some embodiments, the interwoven layers 310 may be composed of a series of deposited layers of metal and dielectric materials, as shown in FIG. 3. In some embodiments, the interwoven layers 310 may be composed of other varying material layers besides metal and/or dielectric to have a specific opaqueness.

Figure 4:
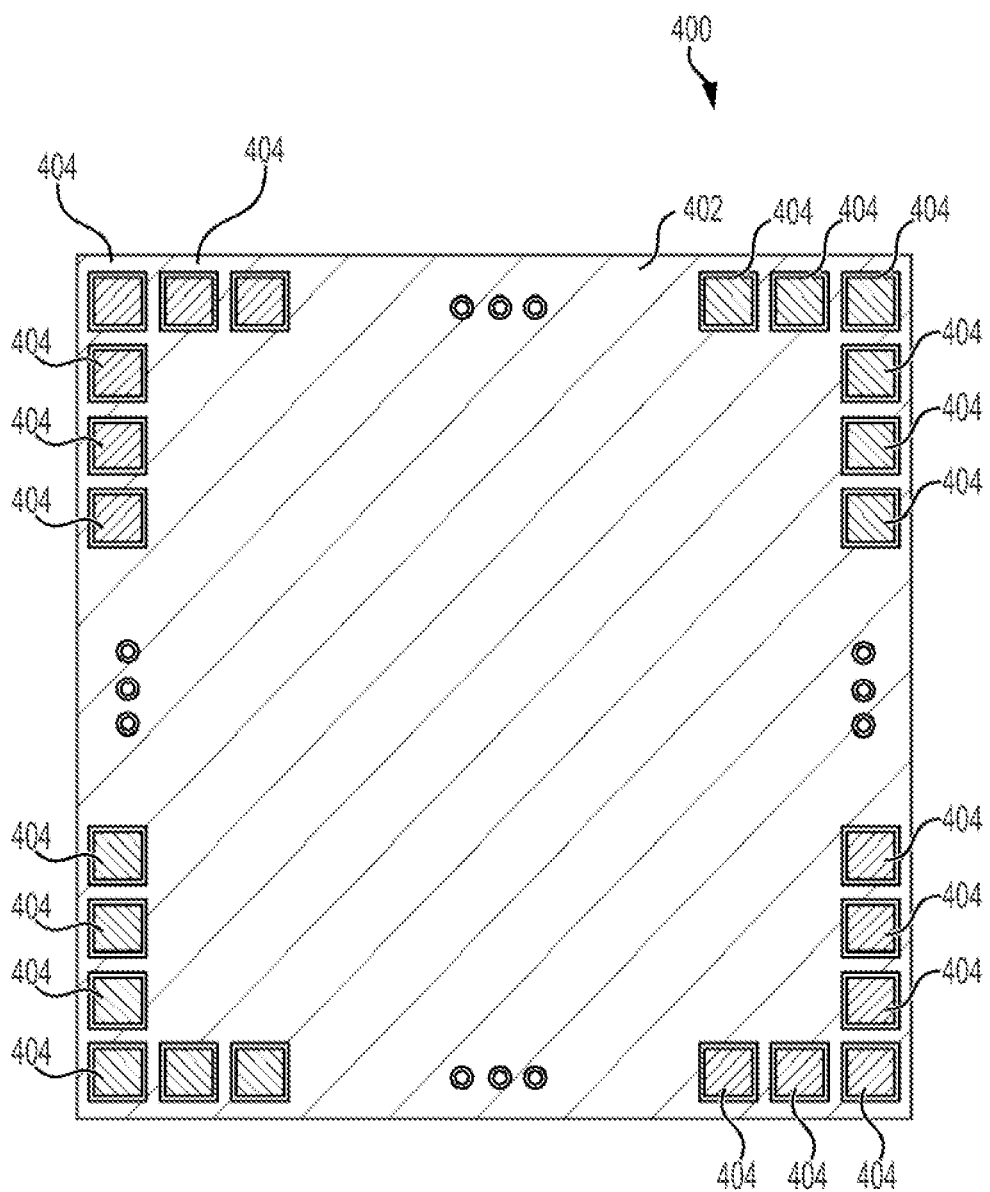
FIG. 4 is a schematic diagram of a back-side view of a flip-chip device with several bond pads, in accordance with some embodiments.

FIG. 4 is a schematic diagram of a back-side view of a flip-chip device 400 with several bond pads 404, in accordance with some embodiments. The flip-chip device 400 may be similar to flip-chip device devices 100 and 102 of FIG. 1, flip-chip device 200 of FIG. 2, or flip-chip device 300 of FIG. 3. In an implementation shown here, the back-side of flip-chip device 400 includes an opaque structure 402. The opaque structure 402 may be similar to opaque structure 104A or 202 or interwoven layers 310, having an opaque material layer on the back-side of their respective flip-chip devices 100, 200, or 300 described herein.

Bond pads 404 may be positioned on the periphery of opaque structure 402 to provide electrical connectivity in flip-chip device 400. The number of bond pads 404 may vary depending on the electrical properties or requirements of flip-chip device 400. In some embodiments, each bond pad 404 is connected to one or more vias in flip-chip device 400. In this case, the vias are similar to vias 204A-204D described herein. In some embodiments, each bond pad 404 is positioned on other areas of opaque structure 402 besides its periphery.

Bond pads 404 are electrically connected to interwoven layers using one or more vias in some embodiments. In some embodiments, each bond pad 404 is connected to interwoven layers positioned within flip-chip device 400. In this instance, the interwoven layers may be similar to interwoven layers 310 described herein.

Figure 5:
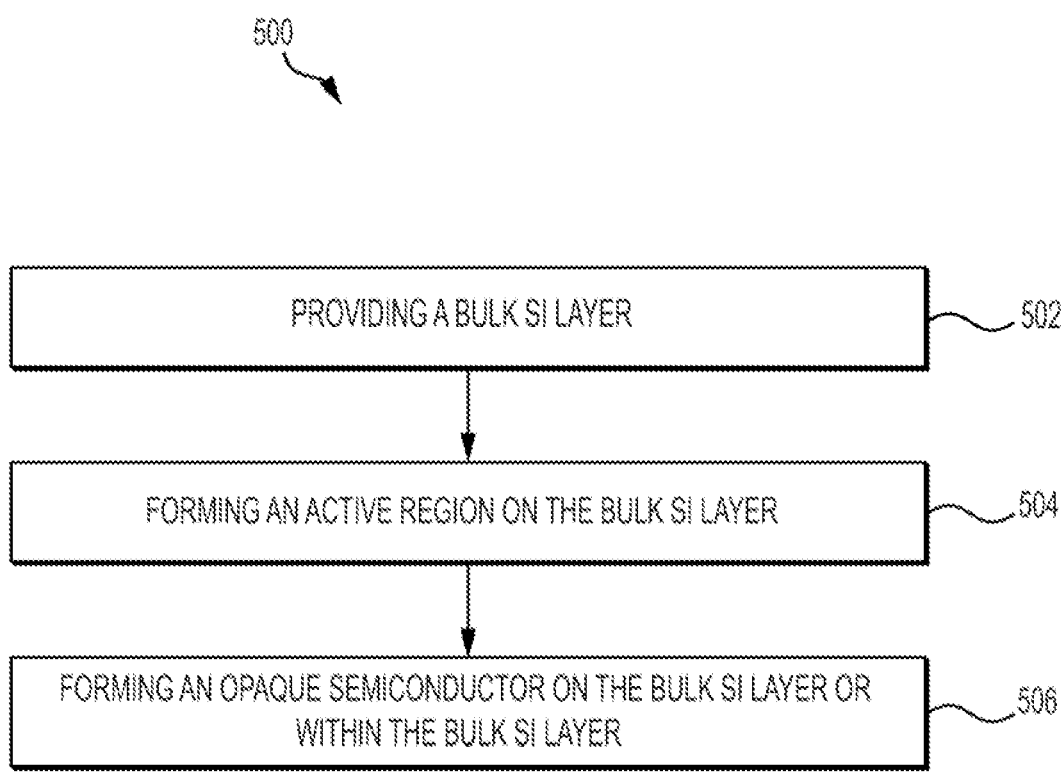
FIG. 5 is a flowgraph of a process for forming an electronic device, in accordance with some embodiment.

FIG. 5 is a flowgraph of a process 500 for forming an electronic device, in accordance with some embodiment. Process 500 includes providing a bulk Si layer, e.g., bulk Si layer 108, 116, 208, or 306 (Step 502). Process 500 includes forming an active region, such as active region 112, 120, 206, or 308, on the bulk Si layer (Step 504). The active region comprises at least one semiconductor component, such as FETs, bumps, or the like, defined by the electronic device's device layout or functions. Moreover, process 500 includes forming an opaque structure, e.g., opaque structure 104A, 104B, or 202 or interwoven layers 310, on the bulk Si layer or within the bulk Si layer (Step 506). The opaque structure is configured to prevent visual or IR imaging of the electronic device to determine the device layout or functions.

Reference in the specification to "one implementation" or "an implementation" means that a particular feature, structure, or characteristic described in connection with the implementation is included in at least one implementation of the disclosure. The appearances of the phrase "in one implementation," "in some implementations," "in one instance," "in some instances," "in one case," "in some cases," "in one embodiment," or "in some embodiments" in various places in the specification are not necessarily all referring to the same implementation or embodiment.

Finally, the above descriptions of the implementations of the present disclosure have been presented for the purposes of illustration and description. It is not intended to be exhaustive or to limit the present disclosure to the precise form disclosed. Many modifications and variations are possible in light of the above teaching. It is intended that the scope of the present disclosure be limited not by this detailed description, but rather by the claims of this application. As will be understood by those familiar with the art, the present disclosure may be embodied in other specific forms without departing from the spirit or essential characteristics thereof. Accordingly, the present disclosure is intended to be illustrative, but not limiting, of the scope of the present disclosure, which is set forth in the following claims.

What is claimed is:

1. An electronic device comprising:
   a bulk Si layer;
   an active region positioned on the bulk Si layer, the active region comprising at least one semiconductor component defined by a device layout or functions of the electronic device; and
   an opaque structure positioned within the bulk Si layer, the opaque structure configured to prevent visual or IR imaging of the electronic device to determine the device layout or functions,
   the opaque structure comprising a first metal region and a second metal region, the first metal region extending in a vertical direction from a bottom of the device to the active region on a top of the device on a first end, the second and metal region extending in the vertical direction from the bottom of the device to the active region on the top of the device on a second end,
   wherein within a central portion of the device, the first and second metal regions comprise interwoven layers in the vertical direction separated by insulator, the central portion being between the first end and the second end, each of the interwoven layers covering the central portion without gaps,
   wherein on the first end of the device, the first metal region is coupled to a backside ground, and
   wherein on the second end of the device, the second metal region is separated from the backside ground by the insulator and coupled to the backside ground by a through silicon (Si) via.

2. The electronic device of claim 1, wherein the interwoven layers are coupled to at least one bond pad tor providing electrical connectivity to the electronic device.

3. The electronic device of claim 2, further comprising at least one through silicon (Si) via for providing electrical connectivity to the electronic device.

4. An electronic device comprising:
   a bulk Si layer;
   an active region positioned on the bulk Si layer, the active region comprising at least one semiconductor component defined by a device layout or functions of the electronic device; and
   an opaque structure positioned within the bulk Si layer, the opaque structure configured to prevent visual or IR imaging of a region of the electronic device,
   the opaque structure comprising a first metal region and a second metal region, the first metal region extending in a vertical direction from a bottom of the device to the active region on a top of the device on a first end, the second and metal region extending in the vertical direction from the bottom of the device to the active region on the top of the device on a second end,
   wherein within a central portion of the device, the first and second metal regions comprise interwoven layers in the vertical direction separated by insulator, the central portion being between the first end and the second end, each of the interwoven layers covering the central portion without gaps,
   wherein on the first end of the device, the first metal region is coupled to a backside ground, and
   wherein on the second end of the device, the second metal region is separated from the backside ground by the insulator and coupled to the backside ground by a through silicon (Si) via.

5. The electronic device of claim 4, wherein the interwoven layers are coupled to at least one bond pad for providing electrical connectivity to the electronic device.

6. The electronic device of claim 5, further comprising at least Through Silicon (Si) Via (TSV) for providing electrical connectivity to the electronic device.

* * * * *

UNITED STATES PATENT AND TRADEMARK OFFICE
CERTIFICATE OF CORRECTION

PATENT NO. : 12,482,723 B2  
APPLICATION NO. : 17/837396  
DATED : November 25, 2025  
INVENTOR(S) : Angelo et al.

Page 1 of 1

It is certified that error appears in the above-identified patent and that said Letters Patent is hereby corrected as shown below:

In the Specification

In Column 1, Line 29, delete "JR" and insert --IR-- therefor

In the Claims

In Column 6, Line 26, in Claim 2, delete "tor" and insert --for-- therefor

Signed and Sealed this  
Tenth Day of February, 2026

John A. Squires  
*Director of the United States Patent and Trademark Office*